XXXXXXX

United States Patent
Sanders et al.

(10) Patent No.: US 7,809,035 B2
(45) Date of Patent: *Oct. 5, 2010

(54) EYE-SAFE LASER NAVIGATION SENSOR

(75) Inventors: Steven Sanders, Belmont, CA (US); Gary Gibbs, San Jose, CA (US); Ashish Pancholy, Milpitas, CA (US); Gajender Rohilla, Bangalore (IN); Pulkit Shah, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 11/432,987

(22) Filed: May 12, 2006

(65) Prior Publication Data

US 2007/0230525 A1  Oct. 4, 2007

(30) Foreign Application Priority Data

Mar. 31, 2006  (IN) ........................... 586/CHE/2006

(51) Int. Cl.
*H01S 3/00* (2006.01)

(52) U.S. Cl. ............... 372/38.02; 372/38.01; 372/38.07

(58) Field of Classification Search .............. 372/38.02, 372/38.01, 38.07
See application file for complete search history.

(56) References Cited

U.S. PATENT DOCUMENTS

| | | | |
|---|---|---|---|
| 3,922,093 A | 11/1975 | Dandliker et al. |
| 4,546,347 A | 10/1985 | Kirsch |
| 4,799,055 A | 1/1989 | Nestler et al. |
| 5,288,993 A | 2/1994 | Bidiville et al. |
| 5,345,527 A | 9/1994 | Lebby et al. |
| 5,473,344 A | 12/1995 | Bacon et al. |
| 5,578,813 A | 11/1996 | Allen et al. |
| 5,606,174 A | 2/1997 | Yoshimura et al. |
| 5,644,139 A | 7/1997 | Allen et al. |
| D382,550 S | 8/1997 | Kaneko et al. |
| D385,542 S | 10/1997 | Kaneko et al. |
| 5,703,356 A | 12/1997 | Bidiville et al. |
| 5,729,008 A | 3/1998 | Blalock et al. |
| 5,729,009 A | 3/1998 | Dandliker et al. |
| 5,781,229 A | 7/1998 | Zediker et al. |
| 5,786,804 A | 7/1998 | Gordon |
| 5,825,044 A | 10/1998 | Allen et al. |
| 5,854,482 A | 12/1998 | Bidiville et al. |
| 5,907,152 A | 5/1999 | Dandliker et al. |

(Continued)

OTHER PUBLICATIONS

International Written Opinion of International Searching Authority, dated Nov. 21, 2008 for International Application No. PCT/US2007/007062; 5 pages.

(Continued)

*Primary Examiner*—Minsun Harvey
*Assistant Examiner*—Patrick Stafford

(57) ABSTRACT

The apparatus includes a diode laser and a current source interconnected with the diode laser. Two independent circuits in the current source are configured to limit current flowing through the diode laser. A first current limiter circuit configured to limit a current output from the current source to an anode of the diode laser, and an independent second current limiter circuit configured to limit a current return from a cathode of the diode laser to the current source so that laser output power does not exceed a specified maximum regardless of a single fault in either the first or second current limiter circuits.

22 Claims, 2 Drawing Sheets

U.S. PATENT DOCUMENTS

| | | | |
|---|---|---|---|
| 5,963,197 | A | 10/1999 | Bacon et al. |
| 5,994,710 | A | 11/1999 | Knee et al. |
| 6,031,218 | A | 2/2000 | Piot et al. |
| 6,037,643 | A | 3/2000 | Knee |
| 6,057,540 | A | 5/2000 | Gordon et al. |
| 6,097,371 | A | 8/2000 | Siddiqui et al. |
| 6,151,015 | A | 11/2000 | Badyal et al. |
| 6,172,354 | B1 | 1/2001 | Adan et al. |
| 6,225,617 | B1 | 5/2001 | Dandliker et al. |
| 6,233,368 | B1 | 5/2001 | Badyal et al. |
| 6,281,881 | B1 | 8/2001 | Siddiqui et al. |
| 6,281,882 | B1 | 8/2001 | Gordon et al. |
| 6,326,950 | B1 | 12/2001 | Liu |
| 6,330,057 | B1 | 12/2001 | Lederer et al. |
| 6,351,257 | B1 | 2/2002 | Liu |
| 6,396,479 | B2 | 5/2002 | Gordon |
| 6,421,045 | B1 | 7/2002 | Venkat et al. |
| 6,424,407 | B1 | 7/2002 | Kinrot et al. |
| 6,433,780 | B1 | 8/2002 | Gordon et al. |
| 6,452,683 | B1 | 9/2002 | Kinrot et al. |
| 6,455,840 | B1 | 9/2002 | Oliver et al. |
| D464,352 | S | 10/2002 | Kerestegian |
| 6,462,330 | B1 | 10/2002 | Venkat et al. |
| 6,476,970 | B1 | 11/2002 | Smith |
| 6,529,184 | B1 | 3/2003 | Julienne |
| 6,585,158 | B2 | 7/2003 | Norskog |
| 6,603,111 | B2 | 8/2003 | Dietz et al. |
| 6,621,483 | B2 | 9/2003 | Wallace et al. |
| 6,642,506 | B1 | 11/2003 | Nahum et al. |
| 6,657,184 | B2 | 12/2003 | Anderson et al. |
| 6,664,948 | B2 | 12/2003 | Crane et al. |
| 6,674,475 | B1 | 1/2004 | Anderson |
| 6,677,929 | B2 | 1/2004 | Gordon et al. |
| 6,703,599 | B1 | 3/2004 | Casebolt et al. |
| 6,737,636 | B2 | 5/2004 | Dietz et al. |
| 6,774,351 | B2 | 8/2004 | Black |
| 6,774,915 | B2 | 8/2004 | Rensberger |
| 6,778,571 | B2 * | 8/2004 | Vaughan ............ 372/38.1 |
| 6,792,020 | B2 * | 9/2004 | Romm ............ 372/38.09 |
| 6,795,056 | B2 | 9/2004 | Norskog et al. |
| 6,809,723 | B2 | 10/2004 | Davis |
| 6,819,314 | B2 | 11/2004 | Black |
| 6,823,077 | B2 | 11/2004 | Dietz et al. |
| 2002/0130835 | A1 | 9/2002 | Brosnan |
| 2002/0158300 | A1 | 10/2002 | Gee |
| 2002/0190953 | A1 | 12/2002 | Gordon et al. |
| 2003/0034959 | A1 | 2/2003 | Davis et al. |
| 2003/0058506 | A1 | 3/2003 | Green et al. |
| 2003/0142288 | A1 | 7/2003 | Kinrot et al. |
| 2003/0171009 | A1 * | 9/2003 | Mercier ............ 439/49 |
| 2004/0084610 | A1 | 5/2004 | Leong et al. |
| 2004/0165629 | A1 * | 8/2004 | Iwakura ............ 372/38.02 |
| 2004/0189593 | A1 | 9/2004 | Koay |
| 2005/0024336 | A1 | 2/2005 | Xie et al. |
| 2005/0024623 | A1 | 2/2005 | Xie et al. |
| 2005/0083303 | A1 | 4/2005 | Schroeder et al. |

OTHER PUBLICATIONS

International Search Report of the International Searching Authority for International Application No. PCT/US07/07062 (SLMP0385PCT) mailed Nov. 21, 2008; 2 pages.

* cited by examiner

EYE-SAFE LASER NAVIGATION SENSOR

TECHNICAL FIELD

The present invention relates generally to optical navigation sensors.

BACKGROUND OF THE INVENTION

Pointing devices, such as computer mice or trackballs, are utilized for inputting data into and interfacing with personal computers and workstations. Such devices allow rapid relocation of a cursor on a monitor, and are useful in many text, database and graphical programs. A user controls the cursor, for example, by moving the mouse over a surface to move the cursor in a direction and over distance proportional to the movement of the mouse. Alternatively, movement of the hand over a stationary device may be used for the same purpose.

Computer mice come in both optical and mechanical versions. Mechanical mice typically use a rotating ball to detect motion, and a pair of shaft encoders in contact with the ball to produce a digital signal used by the computer to move the cursor. One problem with mechanical mice is that they are prone to inaccuracy and malfunction after sustained use due to dirt accumulation, and such. In addition, the movement and resultant wear of the mechanical elements, particularly the shaft encoders, necessarily limit the useful life of the device.

One solution to the above-discussed with mechanical mice problems has been the development of optical mice. Optical mice have become very popular because they are more robust and may provide a better pointing accuracy.

One approach used for optical mice relies on a light emitting diode (LED) illuminating a surface at or near grazing incidence, a two-dimensional CMOS (complementary metal-oxide-semiconductor) detector which captures the resultant images, and software that correlates successive images to determine the direction, distance and speed the mouse has been moved. This technology typically provides high accuracy but suffers from a complex design and relatively high image processing requirements. In addition, the optical efficiency is low due to the grazing incidence of the illumination.

Another approach differs from the standard technology in that it uses a coherent light source, such as a laser. Light from a coherent source scattered off of a rough surface generates a random intensity distribution of light known as speckle. Such an optical navigation sensor which utilizes a laser may be referred to as a laser navigation sensor.

It is highly desirable to improve laser navigation sensors. In particular, it is highly desirable to improve techniques for ensuring eye safety for users operating laser navigation sensors.

SUMMARY

One embodiment relates to an optical navigation apparatus which provides fault-tolerant limitation of laser output power. The apparatus includes a diode laser and a current source interconnected with the diode laser. Two independent circuits in the current source are configured to limit current flowing through the diode laser.

Another embodiment relates to a method of providing fault-tolerant limitation of laser output power in an optical navigation apparatus. A first digital current limit value is converted to a first analog signal, and the first analog signal is used to limit an electrical current from a power supply connection to an anode of a diode laser. A second digital current limit value is converted to a second analog signal, and the second analog signal is used to limit an electrical current from a cathode of the diode laser to a ground connection.

Another embodiment relates to an integrated circuit configured to provide fault-tolerant limitation of laser output power in an optical navigation apparatus. The integrated circuit includes: circuit means for converting a first digital current limit value to a first analog signal; circuit means for using the first analog signal to limit an electrical current from a power supply connection to an anode of a diode laser; circuit means for converting a second digital current limit value to a second analog signal; and circuit means for using the second analog signal to limit an electrical current from a cathode of the diode laser to a ground connection.

Other embodiments are also disclosed.

BRIEF DESCRIPTION OF THE DRAWINGS

These and various other features and advantages of the present disclosure are understood more fully from the detailed description that follows and from the accompanying drawings, which, however, should not be taken to limit the appended claims to the specific embodiments shown, but are for explanation and understanding only.

DETAILED DESCRIPTION

Laser navigation sensors, such as optical laser mouse devices, are generally required to maintain their laser output at eye-safe levels under specific operating conditions and also under single-fault conditions.

Existing approaches for maintaining laser output at eye-safe levels generally require the use of external components and calibration by the mouse manufacturer.

The present application discloses advantageous methods and apparatus for limiting laser output power to maintain eye-safe operation. The methods and apparatus may be implemented in consumer product applications, including optical laser mouse devices.

The methods and apparatus disclosed herein advantageously require no external components and allow the mouse device manufacturer to build the optical sensor into the optical mouse device and ensure eye-safe operation without additional calibration.

Figure 1:
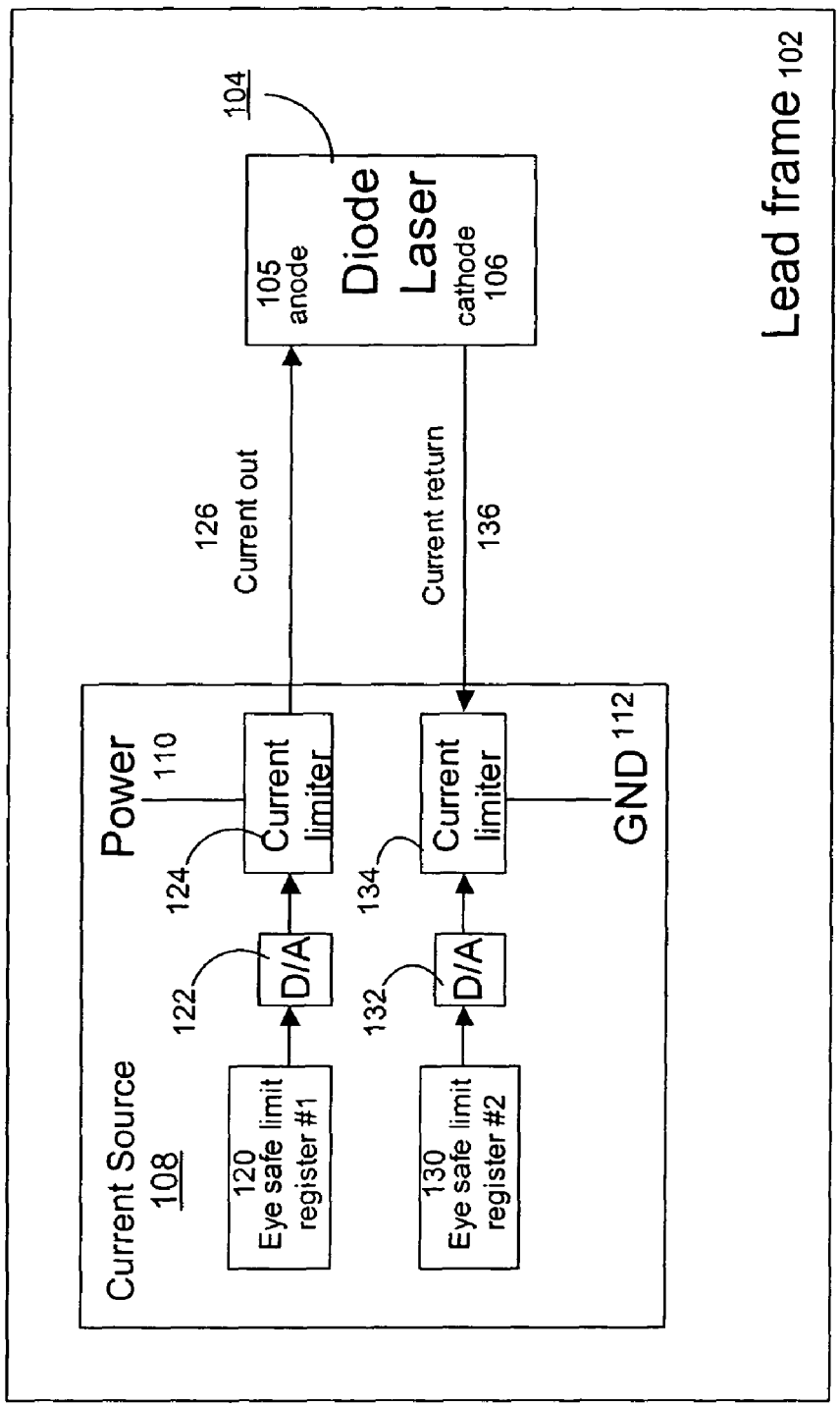
FIG. 1 is a schematic diagram showing an apparatus for limiting laser output power to maintain eye-safe operation of a laser navigation sensor in accordance with an embodiment of the invention.

FIG. 1 is a schematic diagram showing an apparatus 100 for limiting laser output power to maintain eye-safe operation of a laser navigation sensor in accordance with an embodiment of the invention. The apparatus 100 may include a lead frame 102. The lead frame may contain a diode laser 106 current source 108 on a silicon die. The diode laser 104 may comprise, for example, a vertical cavity surface emitting laser (VCSEL). Bond wires (126 and 136) may be configured so as to attach and interconnect the current source output 124 and return 134 to the diode laser anode 105 and cathode 106, respectively.

In accordance with an embodiment of the invention, the current source 108 may be configured with two independent means for limiting the electrical current flowing out of the current source and back into the current source. These two independent means include two independent current limiter circuits 124 and 134.

A first current limiter circuit 124 is configured to limit the electrical current flowing out of the current source. Electrical current flows from a power source 110 through the first current limiter circuit 124 to the laser anode 105.

A first eye-safe limit register (register #1) 120 is a memory register which is programmed to hold a digital value. The digital value therein corresponds to a first current limit (i.e. a first maximum current) which is imposed by the first current limiter circuit 124. The digital value from register #1 120 is transformed into an analog control voltage by a first digital-to-analog (D/A) converter circuit 122. This analog control voltage is used to control the first current limiter circuit 124 so as to impose the first current limit. The current output via the output bond wire 126 from the first current limiter 124 to the anode 105 of the diode laser 104 does not exceed this first current limit.

A second current limiter circuit 134 is configured to limit the electrical current returning to the current source. Electrical current flows from the laser cathode 106 through the second current limiter circuit 134 to an electrical ground 112.

A second eye-safe limit register (register #2) 130 is a memory register which is programmed to hold a digital value. The digital value therein corresponds to a second current limit (i.e. a second maximum current) which is imposed by the second current limiter circuit 134. The digital value from register #2 130 is transformed into an analog control voltage by a second digital-to-analog (D/A) converter circuit 132. This analog control voltage is used to control the second current limiter circuit 134 so as to impose the second current limit. The current input via the return bond wire 136 from the laser cathode 106 to the second current limiter 134 does not exceed this second current limit. The second current limit may be set so as to be equal to the first current limit, or the second current limit may be set to a different current value as the first current limit.

The use of the two independent current limits for the current source and return, as described above, enables the apparatus to advantageously maintain an eye-safe current limit even during physical faults. Such physical faults include, for example, shorting of the diode laser's anode or cathode to supply voltage or ground. The two independent memory locations (120 and 130) and the two independent D/A converters (122 and 132) enable the apparatus to advantageously maintain an eye-safe current limit in the event of a memory corruption fault or a D/A converter fault.

The laser navigation sensor may be operated at a fixed temperature and supply voltage in order to calibrate the eye-safe current limit registers. The current limits may be set such that the output power of the laser diode is lower than the class 1 eye-safe limit, when installed with optics of the mouse device, by an appropriate margin of safety to account for output power variations with temperature, voltage and time.

In accordance with a preferred embodiment, the diode laser comprises a VCSEL emitting an 830 nanometers (nm) wavelength, and the eye-safe limit is set to approximately 0.7 milliwatts (mW). The VCSEL may typically have a slope efficiency of approximately 0.5 milliwatts/milliamperes (mW/mA) and a threshold of 4 to 5 mA.

It is further desirable to provide a current limit setting resolution which provides a sufficient resolution so as to minimize the margin between the eye-safe current for class 1 safety and the programmed current limit. In a preferred embodiment, the eye-safe limit registers and A/D converters may have an 8-bit resolution to enable an approximately 15 microwatt output power resolution over a 0-8 mA current range.

The variation in the eye-safe current limits over operating temperature and supply voltages should be less than 3% in order to limit the power change to less than 100 microamperes. Most of the variation in drive current during operation is typically due to changes in supply voltage. An architecture that would reduce this sensitivity includes supply voltage monitors to correct for changes in supply voltage from the level at calibration. In addition, temperature sensors may be used to correct for temperature variations. Such an architecture is shown in FIG. 2.

Figure 2:
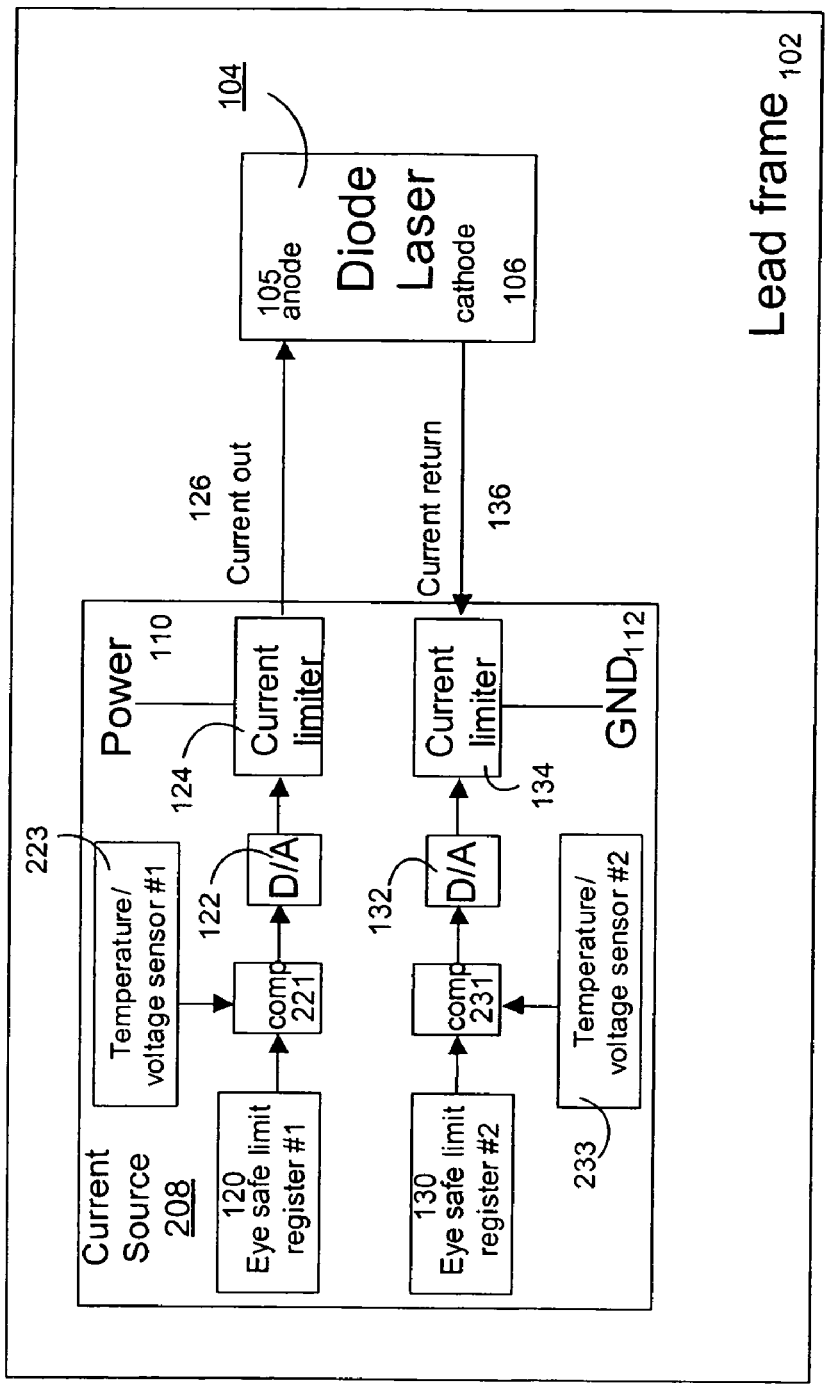
FIG. 2 is a schematic diagram showing an apparatus for limiting laser output power to maintain eye-safe operation of a laser navigation sensor in accordance with another embodiment of the invention.

FIG. 2 is a schematic diagram showing an apparatus 200 for limiting laser output power to maintain eye-safe operation of a laser navigation sensor in accordance with another embodiment of the invention. The current source 208 in this embodiment includes two independent sensor circuits (223 and 233). Each sensor circuit is configured to monitor supply voltage variations and/or sense temperature changes.

Each sensor circuit (223 and 233) has associated compensation circuitry (221 and 231, respectively). Per FIG. 2, each compensation circuit may be configured in between the associated register and the associated D/A converter for its path (either the current out path, or the current return path). As such, each compensation circuit may be configured to modify the digital data read from the associated register and to provide the compensated digital data to the associated D/A converter. Hence, the temperature/voltage sensors and their associated compensation circuitry are independent for each path (output path and return path) so as to maintain fault tolerance in the apparatus.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. An apparatus comprising:
   a diode laser; and
   a current source interconnected with the diode laser, the current source including a first current limiter circuit configured to limit a current output from the current source to an anode of the diode laser, and an independent second current limiter circuit configured to limit a current return from a cathode of the diode laser to the current source so that laser output power does not exceed a specified maximum regardless of a single fault in either the first or second current limiter circuits.

2. The apparatus of claim 1, wherein the current source is integrated onto a single silicon die.

3. The apparatus of claim 2, further comprising:
   two independent memory registers integrated into the current source, wherein the two independent memory registers are programmed to hold digital current limit data.

4. The apparatus of claim 3, further comprising:
   two independent digital-to-analog (D/A) converters integrated into the current source, wherein the two independent D/A converters are each configured to convert the digital current limit data to an analog current limit signal.

5. The apparatus of claim 4, wherein the first and second current limiter circuits are configured to be controlled by the analog current limit signals.

6. The apparatus of claim 5, wherein the first current limiter circuit is configured to limit the current output from the current source to not exceed a first maximum current.

7. The apparatus of claim 6, wherein the second current limiter circuit is configured to limit the current return to the current source to not exceed a second maximum current.

8. The apparatus of claim 5, further comprising:
two independent supply voltage sensors integrated into the current source, wherein the two supply voltage sensors are configured to monitor changes in a supply voltage of the current source; and
two independent compensation circuits controlled by output signals from the two supply voltage sensors.

9. The apparatus of claim 8, wherein each compensation circuit is configured to modify the digital current limit data read from an associated memory register and to provide the voltage-compensated digital data to an associated D/A converter.

10. The apparatus of claim 5, further comprising:
two independent temperature sensors integrated into the current source, wherein the two temperature sensors are configured to monitor changes in an operating temperature; and
two independent compensation circuits controlled by output signals from the two temperature sensors.

11. The apparatus of claim 10, wherein each compensation circuit is configured to modify the digital current limit data read from an associated memory register and to provide the temperature-compensated digital data to an associated D/A converter.

12. The apparatus of claim 5, further comprising:
two independent supply voltage sensors integrated into the current source, wherein the two supply voltage sensors are configured to monitor changes in a supply voltage of the current source; and
two independent temperature sensors integrated into the current source, wherein the two temperature sensors are configured to monitor changes in an operating temperature; and
two independent compensation circuits, wherein each compensation circuit is controlled by output signals from associated voltage and temperature sensors.

13. A method of providing fault-tolerant limitation of laser output power in an optical navigation apparatus, the method comprising:
converting a first digital current limit value to a first analog signal;
using the first analog signal to limit an electrical current from a power supply connection to an anode of a diode laser with a first current limiter circuit configured to limit current so as not to exceed a first maximum current;
converting a second digital current limit value to a second analog signal; and
using the second analog signal to limit an electrical current from a cathode of the diode laser to a ground connection with a second current limiter circuit configured to limit current so as not to exceed a second maximum current, wherein the second current limiter circuit is independent of the first current limiter circuit.

14. The method of claim 13, wherein said converting and using steps are performed with circuitry integrated onto a single silicon die.

15. The method of claim 13, further comprising:
sensing a supply voltage with a first sensor;
compensating for changes in the supply voltage by adjusting the first digital current limit value based on output from the first sensor;
sensing the supply voltage with a second sensor which is independent of the first sensor; and
compensating for changes in the supply voltage by adjusting the second digital current limit value based on output from the second sensor.

16. The method of claim 13, further comprising:
sensing a temperature with a first sensor;
compensating for changes in the temperature by adjusting the first digital current limit value based on output from the first sensor;
sensing the temperature with a second sensor which is independent of the first sensor; and
compensating for changes in the temperature by adjusting the second digital current limit value based on output from the second sensor.

17. An integrated circuit comprising:
circuit means for converting a first digital current limit value to a first analog signal;
circuit means coupled to an anode of a diode laser for using the first analog signal to limit an electrical current from a power supply connection to the anode of the diode laser so as not to exceed a first maximum current;
circuit means for converting a second digital current limit value to a second analog signal; and
circuit means coupled to a cathode of the diode laser for using the second analog signal to limit an electrical current from the cathode of the diode laser to a ground connection so as not to exceed a second maximum current,
wherein the circuit means coupled to the cathode is independent of the circuit means coupled to the anode.

18. The integrated circuit of claim 17, further comprising:
a first sensor circuit for sensing a supply voltage;
circuit means for compensating for changes in the supply voltage by adjusting the first digital current limit value based on output from the first sensor circuit;
a second sensor circuit for sensing the supply voltage which is independent of the first sensor circuit; and
circuit means for compensating for changes in the supply voltage by adjusting the second digital current limit value based on output from the second sensor circuit.

19. The integrated circuit of claim 17, further comprising:
a first sensor for sensing a temperature;
circuit means for compensating for changes in the temperature by adjusting the first digital current limit value based on output from the first sensor;
a second sensor for sensing the temperature which is independent of the first sensor; and
circuit means for compensating for changes in the temperature by adjusting the second digital current limit value based on output from the second sensor.

20. An apparatus comprising:
a diode laser; and
a current source interconnected with the diode laser;
a first independent circuit coupled to an anode of the diode laser and configured to limit a current out from the current source to the diode laser so as not to exceed a first maximum current; and a second independent circuit coupled to a cathode of the diode laser and configured to limit a current return from the diode laser to the current source so as not to exceed a second maximum current.

21. The apparatus of claim 20, further comprising:

a first memory register;

a first digital-to-analog converter coupled to the first memory register;

a second memory register; and a second digital-to-analog converter coupled to the second memory register, wherein the first memory register and the first digital-to-analog converter are configured to program the first maximum current for the first independent circuit, and wherein the second memory register and the second digital-to-analog converter are configured to program the second maximum current for the second independent circuit.

22. The apparatus of claim 1, wherein the diode laser comprises a vertical cavity surface emitting laser (VCSEL), and the specified maximum current is 0.7 milliwatts or less.

* * * * *